(12) United States Patent
Shen et al.

(10) Patent No.: US 6,580,168 B2
(45) Date of Patent: Jun. 17, 2003

(54) METHOD FOR MANUFACTURING A LOW-PROFILE SEMICONDUCTOR DEVICE

(76) Inventors: Ming-Tung Shen, 4F, No. 52, Sec. 2, Chung Shan N. Rd., Taipei City (TW); I-Ming Chen, No. 60, Lane 328, Li-Shan St., Nei-Hu Dist., Taipei City (TW)

( * ) Notice: Subject to any disclaimer, the term of this patent is extended or adjusted under 35 U.S.C. 154(b) by 0 days.

(21) Appl. No.: 10/001,039

(22) Filed: Nov. 13, 2001

(65) Prior Publication Data

US 2003/0090004 A1 May 15, 2003

(51) Int. Cl.$^7$ ................................................ H01L 23/48
(52) U.S. Cl. ...................... 257/737; 257/738; 257/778; 257/780; 257/779
(58) Field of Search ................................ 257/737, 738, 257/778, 780, 779

(56) References Cited

U.S. PATENT DOCUMENTS 6,046,910 A * 4/2000 Ghaem et al. .............. 361/760

* cited by examiner

Primary Examiner—David L. Talbott
Assistant Examiner—Luan Thai
(74) Attorney, Agent, or Firm—Marger Johnson & McCollom, P.C.

(57) ABSTRACT

A method for manufacturing a semiconductor device includes the steps of forming a hardened photoresist layer on a bonding pad of a semiconductor chip, forming a conductive layer on the hardened photoresist layer to form a conductive bump on the bonding pad, forming a plurality of supporting pads on the semiconductor chip, attaching a chip-mounting substrate on the semiconductor chip such that the supporting pads interconnect the semiconductor chip and the substrate, and forming an insulating layer that fills a space between the semiconductor chip and the substrate and that encloses the conductive bump.

12 Claims, 5 Drawing Sheets

METHOD FOR MANUFACTURING A LOW-PROFILE SEMICONDUCTOR DEVICE

BACKGROUND OF THE INVENTION

1. Field of the Invention

This invention relates to a method for manufacturing a low-profile semiconductor device.

2. Description of the Related Art

The sizes of semiconductor chips can vary widely with different chip packaging techniques. With the rapid advancement in electronic devices, minimization of profiles of semiconductor chips has been a major concern of manufacturers. Although the profiles of semiconductor chips can be made relatively low by current packaging techniques, there is still a need to further reduce the profiles of the semiconductor chips.

SUMMARY OF THE INVENTION

Therefore, the main object of the present invention is to provide a method for manufacturing a semiconductor device with a low-profile.

Another object of the present invention is to provide a low-profile semiconductor device.

According to one aspect of the present invention, there is provided a method for manufacturing a semiconductor device. The method comprises the steps of: preparing a chip-mounting substrate having a chip-mounting surface that is provided with at least a conductive contact thereon; preparing a semiconductor chip having a pad-mounting surface that is provided with at least a bonding pad thereon; forming a hardened photoresist layer on one of the bonding pad and the conductive contact, the hardened photoresist layer having a geometric dimension that is smaller than that of said one of the bonding pad and the conductive contact so as to expose a portion of said one of the bonding pad and the conductive contact therefrom; forming a conductive layer that encloses the hardened photoresist layer and that covers the portion of said one of the bonding pad and the conductive contact so as to form a conductive bump on said one of the bonding pad and the conductive contact; forming a plurality of spaced apart supporting pads on the pad-mounting surface; and attaching the chip-mounting substrate to the semiconductor chip such that the other one of the bonding pad and the conductive contact is electrically connected to the conductive bump and such that the supporting pads interconnect the chip-mounting surface of the chip-mounting substrate and the pad-mounting surface of the semiconductor chip.

According to another aspect of the present invention, a semiconductor device comprises: a semiconductor chip having a pad-mounting surface that is provided with at least a bonding pad thereon; a plurality of supporting pads formed on the pad-mounting surface; a chip-mounting substrate attached to the semiconductor chip and having a chip-mounting surface that is formed with at least a conductive contact; and at least a conductive bump which is formed on one of the bonding pad and the conductive contact, the conductive bump including a hardened photoresist layer that is formed on said one of the bonding pad and the conductive contact and that has a geometric dimension smaller than that of the bonding pad so as to expose a portion of said one of the bonding pad and the conductive contact therefrom, the conductive bump further including a conductive layer enclosing the hardened photoresist layer and covering the portion of said one of the bonding pad and the conductive contact; the chip-mounting substrate being attached to the semiconductor chip in a manner that the other one of the bonding pad and the conductive contact is electrically connected to the conductive layer of the conductive bump and that the supporting pads interconnect the chip-mounting surface of the chip-mounting substrate and the pad-mounting surface of the semiconductor chip.

BRIEF DESCRIPTION OF THE DRAWINGS

In drawings which illustrate embodiments of the invention.

DETAILED DESCRIPTION OF THE PREFERRED EMBODIMENT

Figure 1:
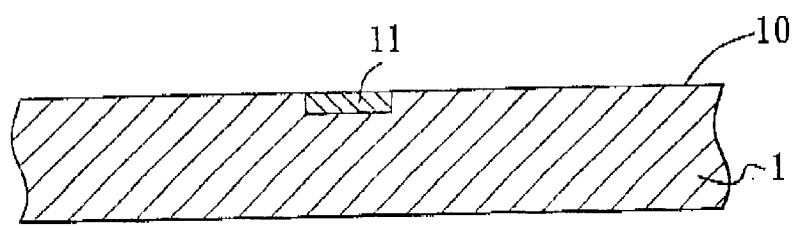
FIGS. 1 and 2 illustrate the formation of a photoresist layer on a bonding pad of a semiconductor chip according to the preferred embodiment of a method of this invention.
Figure 2:
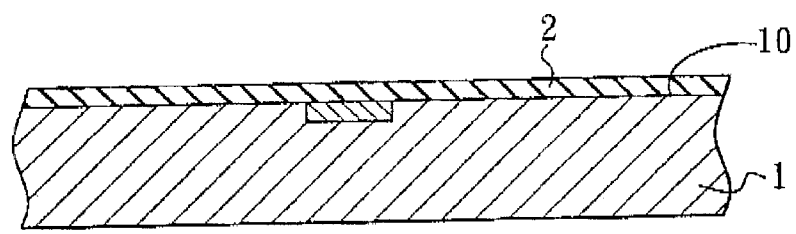
Figure 3:
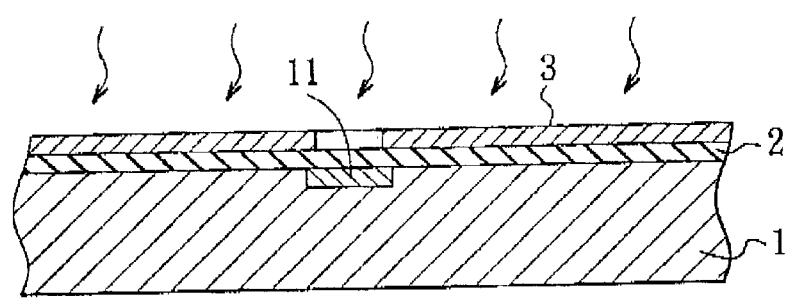
FIGS. 3 and 4 illustrate the formation of a hardened photoresist on the bonding pad of the semiconductor chip via photomasking and etching techniques according to the preferred embodiment.
Figure 4:
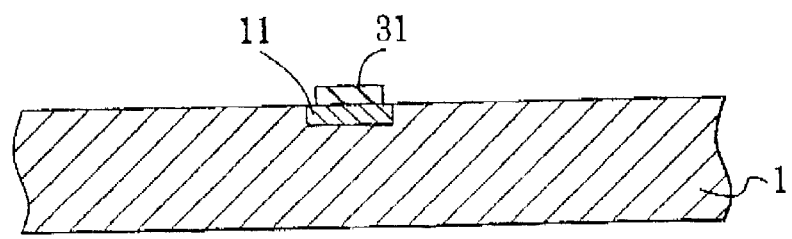
Figure 5:
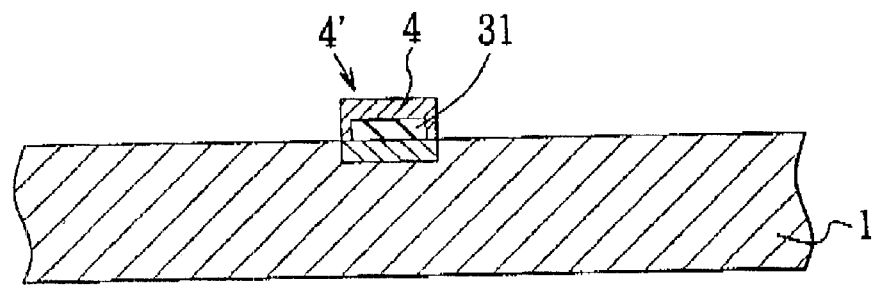
FIG. 5 illustrates the formation of a conductive layer on the hardened photoresist layer of FIG. 4 according to the preferred embodiment.
Figure 6:
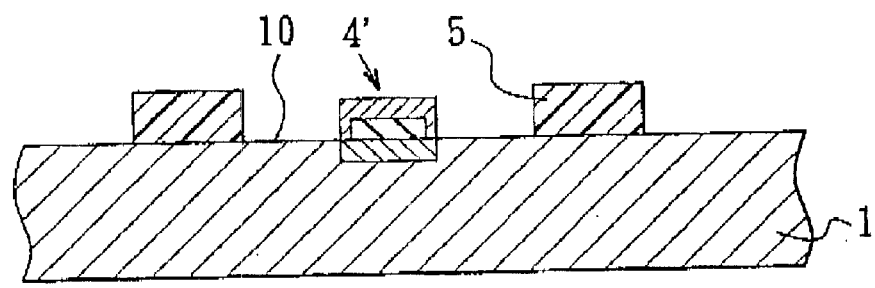
FIG. 6 illustrates the formation of a plurality of supporting pads on a pad-mounting surface of the semiconductor chip according to the preferred embodiment.
Figure 7:
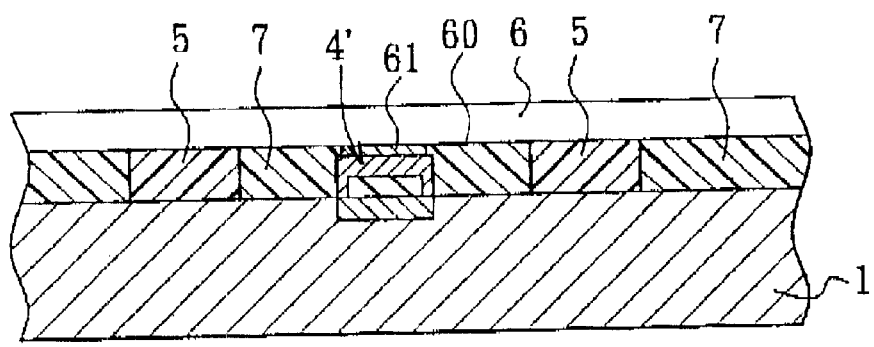
FIG. 7 illustrates the formation of an insulating layer between a chip-mounting substrate and the semiconductor chip according to the preferred embodiment.

FIGS. 1 to 7 illustrate consecutive steps of processing a semiconductor chip 1 and a chip-mounting substrate 6 for forming the preferred embodiment of a semiconductor device according to the method of this invention.

The method includes the steps of: preparing the chip-mounting substrate 6 (see FIG. 7) having a chip-mounting surface 60 that is provided with at least a conductive contact 61 thereon; preparing the semiconductor chip 1 (see FIG. 1) having a pad-mounting surface 10 that is provided with at least a bonding pad 11 thereon; forming a photoresist layer 2 (see FIG. 2) on the pad-mounting surface 10 of the semiconductor chip 1 via printing techniques; heating the photoresist layer 2; masking the photoresist layer 2 with a mask 3 (see FIG. 3) to define an exposed region on the photoresist layer 2 which is registered with the bonding pad 11; subsequently radiating the photoresist layer 2 at the exposed region and removing the photoresist layer 2 at the unexposed region via solvent washing so as to form a hardened photoresist layer 31 (see FIG. 4) on the bonding pad 11, the hardened photoresist layer 31 having a geometric dimension that is smaller than that of the bonding pad 11 so as to expose a portion of the bonding pad 11 therefrom; forming a conductive layer 4 (see FIG. 5), which encloses the hardened photoresist layer 31 and which covers the portion of the bonding pad 11, via metal vapor deposition so as to form a conductive bump 4' on the bonding pad 11; forming a plurality of spaced apart supporting pads 5 (see FIG. 6) on the pad-mounting surface 10; attaching the chip-mounting substrate 6 to the semiconductor chip 1 such that the conductive contact 61 is electrically connected to the conductive layer 4 of the conductive bump 4' and such that the supporting pads 5 interconnect the chip-mounting surface 60 of the chip-mounting substrate 6 and the pad-mounting surface 10 of the semiconductor chip 1; and forming an insulating layer 7 (see FIG. 7) between the chip-mounting substrate 6 and the semiconductor chip 1 by filling a resin or a gel material in a space between the chip-mounting surface 60 of the chip-mounting substrate 6 and the pad-mounting surface 10 of the semiconductor chip 1 to enclose the supporting pads 5, the conductive contact 61 and the conductive bump 4' within the insulating layer 7.

It is noted that, instead of being formed on the bonding pad 11, the conductive bump 4' can be formed on the conductive contact 61 of the chip-mounting substrate 6.

The metal used for the conductive layer 4 is selected from a group consisting of gold, silver, copper, aluminum, and tin.

The supporting pads 5 are preferably made of a double-sided adhesive tape or a resin material having adhesive characteristics.

Figure 8:
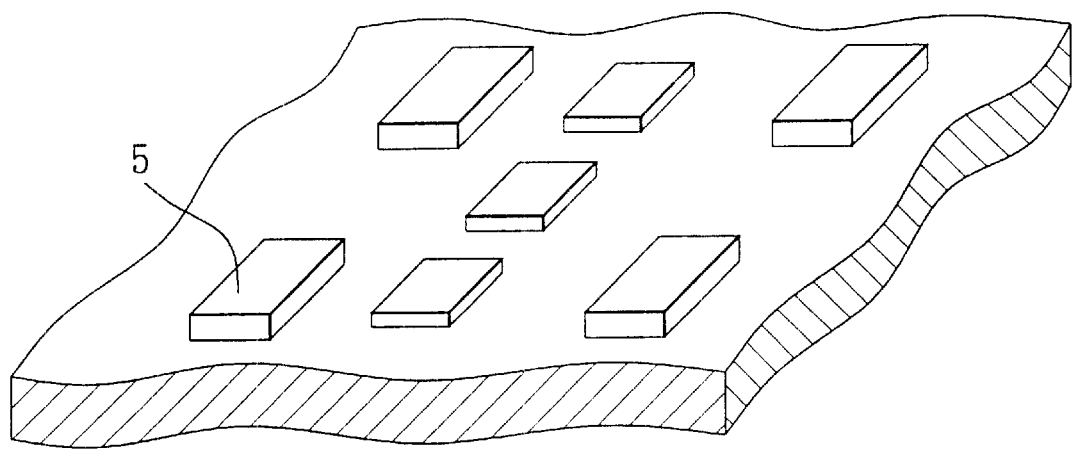
FIGS. 8 and 9 illustrate different configurations of the supporting pads used in the semiconductor device according to the preferred embodiment.
Figure 9:
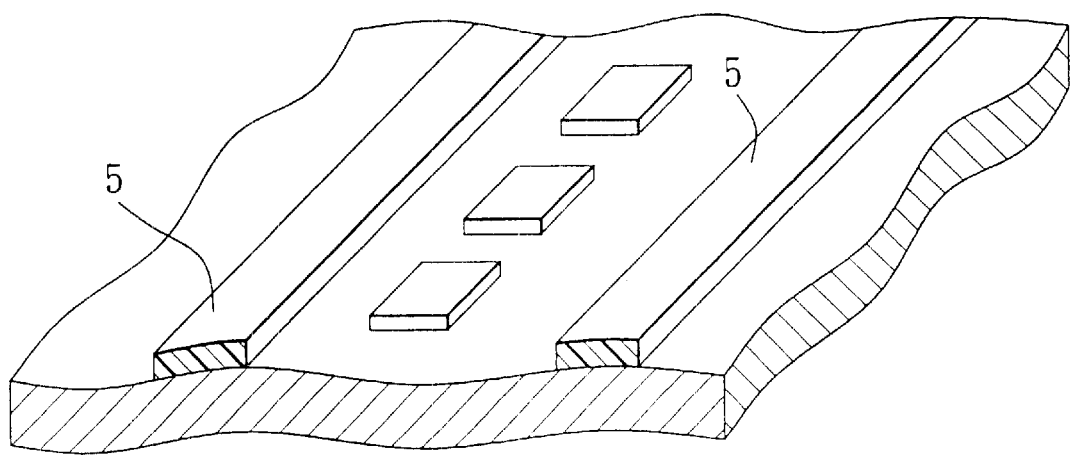
Figure 10:
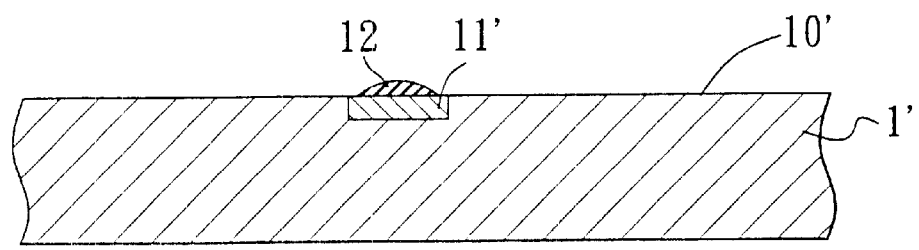
FIG. 10 illustrates the formation of a connecting member on a bonding pad of a semiconductor chip according to a second preferred embodiment of a method of this invention.
Figure 11:
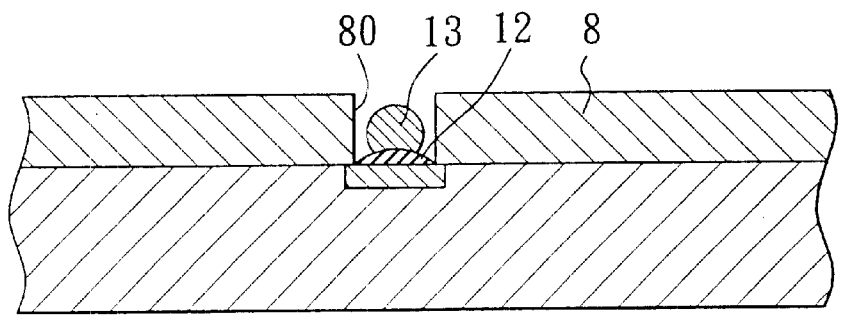
FIG. 11 illustrates the formation of a spherical member on the connecting member using a masking sheet according to the second preferred embodiment.
Figure 12:
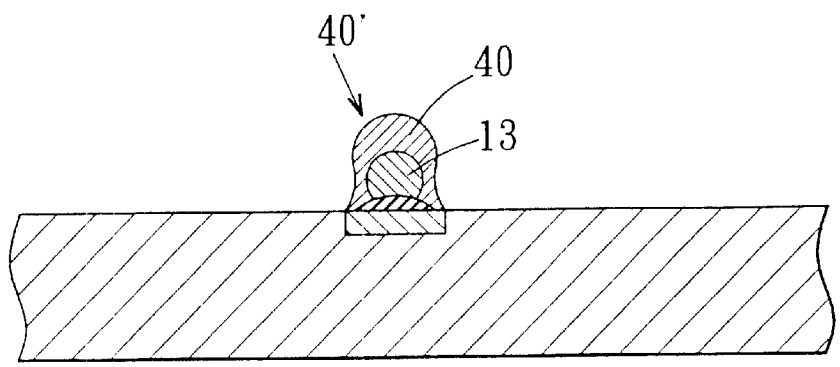
FIG. 12 illustrates the formation of a conductive layer on the spherical member according to the second preferred embodiment.
Figure 13:
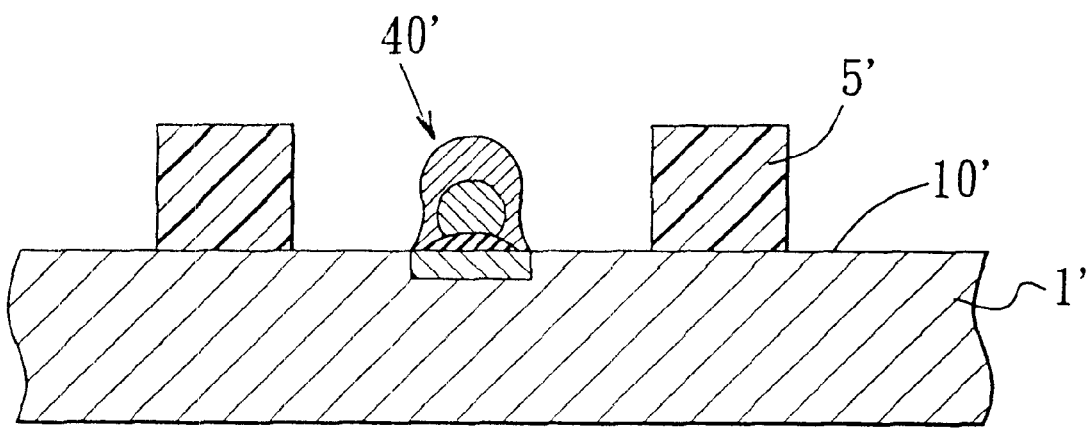
FIG. 13 illustrates the formation of a plurality of supporting pads on a pad-mounting surface of the semiconductor chip according to the second preferred embodiment.
Figure 14:
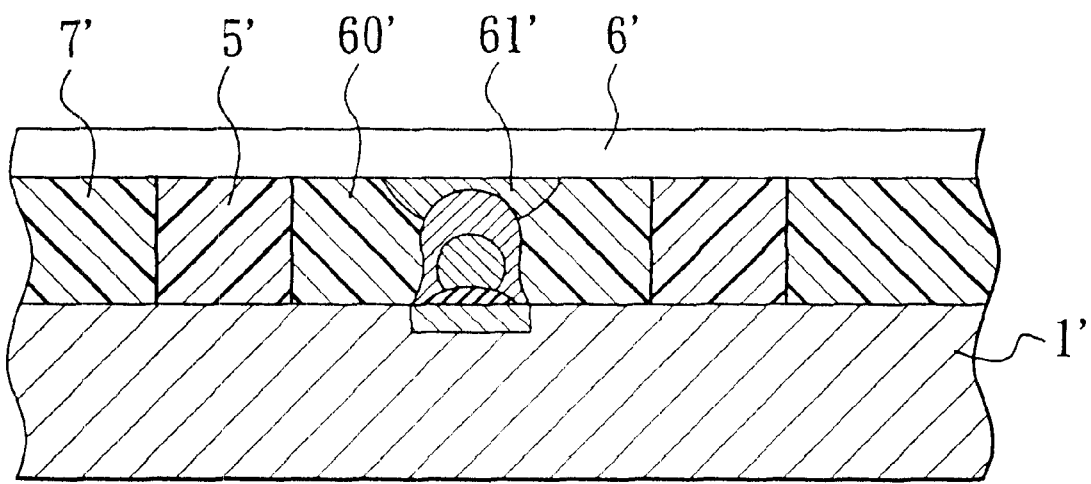
FIG. 14 illustrates the formation of an insulating layer between a chip-mounting substrate and the semiconductor chip according to the second preferred embodiment.

FIGS. 8 and 9 illustrate different preferred configurations of the supporting pads 5 that can be used in the semiconductor device according to the preferred embodiment of this invention.

It is noted that the profile of the conductive bump 4' formed according to the method of this invention can be reduced to a height of about 75 $\mu$m. Moreover, it takes about 1 hour to form the conductive bump 4' having a height of about 75 $\mu$m as compared to those of the prior art that normally require up to 20 hours to form the conductive bumps.

FIGS. 10 to 14 illustrate consecutive steps of processing a semiconductor chip 1' and a chip-mounting substrate 6' for forming a second preferred embodiment of a semiconductor device according to the method of this invention.

The method includes the steps of: preparing the chip-mounting substrate 6' (see FIG. 14) having a chip-mounting surface 60' that is provided with at least a conductive contact 61' thereon; preparing the semiconductor chip 1' (see FIG. 10) having a pad-mounting surface 10' that is provided with at least a bonding pad 11' thereon; forming a connecting member 12 (see FIG. 10) on the bonding pad 11' via printing techniques such that the connecting member 12 has a geometric dimension smaller than that of the bonding pad 11' so as to expose a portion of the bonding pad 11', the connecting member 12 having adhesive characteristics and being preferably made from epoxy resin; preparing a masking sheet 8 (see FIG. 11) that is formed with at least an opening 80; laying the masking sheet 8 on the pad-mounting surface 10' such that the connecting member 12 and the portion of the bonding pad 11' are exposed from the opening 80; forming a spherical member 13 (see FIG. 11) on the connecting member 12 within the opening 80; removing the masking sheet 8 from the pad-mounting surface 10'; forming a conductive layer 40 (see FIG. 12) via metal vapor deposition to enclose the spherical member 13 and the connecting member 12 and to cover the portion of the bonding pad 11' so as to form a conductive bump 40' on the bonding pad 11'; forming a plurality of spaced apart supporting pads 5' (see FIG. 13) on the pad-mounting surface 10'; attaching the chip-mounting substrate 6' to the semiconductor chip 1' in a manner that the conductive contact 61' is electrically connected to the conductive layer 40 of the conductive bump 40' and that the supporting pads 5' interconnect the chip-mounting surface 60' of the chip-mounting substrate 6' and the pad-mounting surface 10' of the semiconductor chip 1'; and forming an insulating layer 7' (see FIG. 14) between the chip-mounting substrate 6' and the semiconductor chip 1' by filling a resin or a gel material in a space between the chip-mounting substrate 6' and the semiconductor chip 1' to enclose the supporting pads 5', the conductive contact 61', and the conductive bump 40' within the insulating layer 7'.

The materials used for the formation of the conductive layer 40, the supporting pads 5' and the insulating layer 7' are respectively the same as those in the previous embodiment. The connecting member 12 and the spherical member 13 can be conductive or non-conductive.

With the invention thus explained, it is apparent that various modifications and variations can be made without departing from the spirit of the present invention. It is therefore intended that the invention be limited only as recited in the appended claims.

We claim:
1. A semiconductor device comprising:
   a semiconductor chip having a pad-mounting surface that is provided with at least a bonding pad thereon;
   a plurality of supporting pads formed on said pad-mounting surface;
   a chip-mounting substrate attached to said semiconductor chip and having a chip-mounting surface that is formed with at least a conductive contact; and
   at least a conductive bump which is formed on one of said bonding pad and said conductive contact, said conductive bump including a hardened photoresist layer that is formed on said one of said bonding pad and said conductive contact and that has a geometric dimension smaller than that of said bonding pad so as to expose a portion of said one of said bonding pad and said conductive contact therefrom, said conductive bump further including a conductive layer enclosing said hardened photoresist layer and covering said portion of said one of said bonding pad and said conductive contact;
   said chip-mounting substrate being attached to said semiconductor chip in a manner that the other one of said bonding pad and said conductive contact is electrically connected to said conductive layer of said conductive bump and that said supporting pads interconnect said chip-mounting surface of said chip-mounting substrate and said pad-mounting surface of said semiconductor chip.

2. The semiconductor device of claim 1, wherein said conductive bump is formed on said bonding pad.

3. The semiconductor device of claim 1, further comprising an insulating layer between said chip-mounting substrate and said semiconductor chip to enclose said supporting pads, said conductive contact, and said conductive bump.

4. The semiconductor device of claim 1, wherein said conductive layer is made from a metal selected from a group consisting of gold, silver, copper, aluminum, and tin.

5. The semiconductor device of claim 1, wherein said supporting pads are made of a double-sided adhesive tape.

6. The semiconductor device of claim 1, wherein said supporting pads are made of a resin material having adhesive characteristics.

7. A semiconductor device comprising:

a semiconductor chip having a pad-mounting surface that is provided with at least a bonding pad thereon and a conductive bump which is formed on said bonding pad and which includes a connecting member formed on said bonding pad and having a geometric dimension smaller than that of said bonding pad so as to expose a portion of said bonding pad, said connecting member having adhesive characteristics, said conductive bump further including a spherical member formed on said connecting member, and a conductive layer that encloses said spherical member and said connecting member and that covers said portion of said bonding pad;

a plurality of supporting pads formed on said pad-mounting surface; and a chip-mounting substrate having a chip-mounting surface that is provided with at least a conductive contact thereon, and attached to said semiconductor chip in a manner that said conductive contact is electrically connected to said conductive layer of said conductive bump and that said supporting pads interconnect said chip-mounting surface of said chip-mounting substrate and said pad-mounting surface of said semiconductor chip.

8. The semiconductor device of claim 7, further comprising an insulating layer between said chip-mounting substrate and said semiconductor chip to enclose said supporting pads, said conductive contact, and said conductive bump.

9. The semiconductor device of claim 7, wherein said connecting member is made from epoxy resin, and is formed by printing techniques.

10. The semiconductor device of claim 7, wherein said supporting pads are made of a double-sided adhesive tape.

11. The semiconductor device of claim 7, wherein said supporting pads are made of a resinous adhesive.

12. The semiconductor device of claim 7, wherein said conductive layer is made from a metal selected from a group consisting of gold, silver, copper, aluminum, and tin.

* * * * *